US006934816B2

United States Patent
Matthews et al.

(10) Patent No.: US 6,934,816 B2
(45) Date of Patent: Aug. 23, 2005

(54) INTEGRATED CIRCUIT MEMORY DEVICES HAVING ASYNCHRONOUS FLOW-THROUGH CAPABILITY

(75) Inventors: Frank Matthews, Alpharetta, GA (US); Chenhao Geng, Duluth, GA (US); Jessica Ye, Suwanee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 654 days.

(21) Appl. No.: 10/025,093

(22) Filed: Dec. 18, 2001

(65) Prior Publication Data

US 2003/0037208 A1 Feb. 20, 2003

Related U.S. Application Data

(60) Provisional application No. 60/310,680, filed on Aug. 7, 2001.

(51) Int. Cl.[7] ................................. G06F 12/00
(52) U.S. Cl. .............. 711/149; 711/150; 365/189.05; 365/189.04; 365/230.05; 365/230.08
(58) Field of Search ................ 365/189.04, 189.05, 365/230.05; 711/149

(56) References Cited

U.S. PATENT DOCUMENTS

| | | | |
|---|---|---|---|
| 4,998,221 A | | 3/1991 | Correale, Jr. |
| 5,197,035 A | * | 3/1993 | Ito ................. 365/230.05 |
| 5,321,652 A | * | 6/1994 | Ito ................. 365/189.07 |
| 5,612,916 A | | 3/1997 | Neduva |
| 5,642,324 A | | 6/1997 | Chosh et al. |
| 5,699,530 A | | 12/1997 | Rust et al. |
| 5,761,147 A | * | 6/1998 | Lindner et al. ........ 365/230.05 |
| 5,940,334 A | | 8/1999 | Holst |
| 5,991,209 A | | 11/1999 | Chow |
| 5,999,478 A | * | 12/1999 | Proebsting .......... 365/230.05 |
| 6,000,016 A | | 12/1999 | Curtis et al. |
| 6,067,598 A | | 5/2000 | Roohparvar et al. |
| 6,104,653 A | | 8/2000 | Proebsting |
| 6,163,475 A | | 12/2000 | Proebsting |
| 6,181,634 B1 | * | 1/2001 | Okita ................ 365/230.05 |
| 6,198,682 B1 | | 3/2001 | Proebsting |
| 6,208,575 B1 | | 3/2001 | Proebsting |
| 6,212,109 B1 | | 4/2001 | Proebsting |
| 6,240,046 B1 | | 5/2001 | Proebsting |
| 6,445,638 B1 | * | 9/2002 | Hsu et al. ........... 365/230.05 |

OTHER PUBLICATIONS

High–Speed 4K×18 Dual–Port Static Ram, IDT7034S/L, IDT, Sep. 1999, 19 pages.

* cited by examiner

*Primary Examiner*—Donald Sparks
*Assistant Examiner*—Jesse Diller
(74) *Attorney, Agent, or Firm*—Myers Bigel Sibley & Sajovec

(57) ABSTRACT

Asynchronous memory devices utilize loopback circuitry to provide efficient and high speed "flow-through" of write data when conventional flow-through operations are not available. An exemplary memory device includes a memory array having first and second ports that can each support asynchronous read and write access and a first input/output control circuit. The first input/output control circuit is electrically coupled to the first port and includes a first sense amplifier, which is configured to receive read data from the first port, and a first bypass latch having an output coupled to the first sense amplifier. A second input/output control circuit is also provided. The second input/output control circuit is electrically coupled to the second port and includes a second sense amplifier, which is configured to receive read data from the second port, and a second bypass latch.

27 Claims, 8 Drawing Sheets

INTEGRATED CIRCUIT MEMORY DEVICES HAVING ASYNCHRONOUS FLOW-THROUGH CAPABILITY

REFERENCE TO PRIORITY APPLICATION

This application claims priority to U.S. provisional application Ser. No. 60/310,680, filed Aug. 7, 2001, the disclosure of which is hereby incorporated herein by reference.

FIELD OF THE INVENTION

The present invention relates to integrated circuit devices and, more particularly, to asynchronous multi-port integrated circuit memory devices and methods of operating asynchronous multi-port integrated circuit memory devices.

BACKGROUND OF THE INVENTION

Conventional asynchronous flow-through operations in multi-port memory devices typically include performing a write operation to a write port that is closely followed by a read operation to a read port. Such flow-through operations may include writing new data into a row of memory cells located at a first address and then allowing that newly written data to "trickle" or "fall" through the memory cells and pass out of the read port during a read operation to the same address. FIG. 1 illustrates a conventional asynchronous multi-port memory device that can perform conventional flow-through operations. This memory device includes a memory array (e.g., SRAM array) and left and write address decoders that are coupled to the memory array. Arbitration, interrupt and semaphore control logic is also provided. Left and write input/output control circuits are provided for routing input and output data between input/output lines (shown as $I/O_{0L-17L}$ and $I/O_{0R-17R}$) and the memory array. This conventional memory device is more fully described in a product datasheet for a high-speed 4K×18 Dual-Port Static Ram (IDT7034S/L), published by Integrated Device Technology of Santa Clara, Calif. and available at http://www.idt.com. The disclosure of this datasheet is hereby incorporated herein by reference. Conventional read, write and flow-through operations performed by asynchronous memory devices are illustrated by TABLE 1. In particular, TABLE 1 illustrates that right-to-left flow-through operations will occur when the write access to a first address by the right port precedes the read access to the same address by the left port. Likewise, left-to-right flow-through operations will occur when the write access to a first address by the left port precedes the read access to the same address by the right port.

TABLE 1

| Left Port (L) | Right Port (R) | Timing | Function |
| --- | --- | --- | --- |
| Read access | Read access | No limit | Both read access |
| Write access | Write access | L before R | R inhibited |
| | | R before L | L inhibited |
| Read access | Write access | L before R | R inhibited |
| | | R before L | R -> L Flow through |
| Write access | Read access | L before R | L -> R Flow through |
| | | R before L | L inhibited |

Conventional flow-through operations may also be performed by synchronous memory devices that utilize on-chip clock signals to carefully control timing of read and write operations. Such conventional flow-through operations in synchronous memory devices may be referred to as write-through-read operations. An exemplary flow-through operation is more fully described in U.S. Pat. No. 4,998,221 to Correale, Jr., entitled "Memory By-Pass for Write through Read Operations". U.S. Pat. No. 5,699,530 to Rust et al., entitled "Circular Ram-Based First-IN/First-Out Buffer Employing Interleaved Storage Locations and Cross Pointers", also discloses synchronous flow-through that may be utilized in a FIFO memory device. Notwithstanding these disclosures of conventional flow-through operations, there continues to be a need for asynchronous memory devices that can efficiently provide flow-through even when their memory architectures do not support conventional flow-through operations.

SUMMARY OF THE INVENTION

Asynchronous multi-port integrated circuit memory devices according to the present invention utilize preferred loopback operations to provide efficient "flow-through" of write data when conventional flow-through operations are not available. Exemplary multi-port memory devices that typically cannot provide conventional flow-through when closely spaced read and write operations are performed to the same memory address include, but are not limited to, multi-port memory devices having pulsed sense amplifiers in the read path.

According to a first embodiment of the present invention, an integrated circuit memory device is provided that includes a memory array having first and second ports that can each support asynchronous read and write access and a first input/output control circuit. The first input/output control circuit is electrically coupled to the first port and includes a first sense amplifier configured to receive read data from the first port and a first bypass latch having an output coupled to the first sense amplifier. A second input/output control circuit is also provided. The second input/output control circuit is electrically coupled to the second port and includes a second sense amplifier, configured to receive read data from the second port, and a second bypass latch. The second bypass latch has an output coupled to the second sense amplifier and an input coupled to receive write data directly from the first input/output control circuit during a first-to-second flow-through mode. The first bypass latch also has an input coupled to receive write data directly from the second input/output control circuit during a second-to-first flow-through mode.

According to a second embodiment of the present invention, methods of operating asynchronous multi-port memory devices include writing new data from a first port of the memory device to a write address therein and also writing the new data directly into to a bypass latch associated with another port (e.g., second port) of the memory device. An operation is also performed to read old data from a read address in the memory device to a sense amplifier associated with the second port. The operation to write new data to the bypass latch associated with another port preferably occurs with each write operation and is independent of the value of the write address relative to the read address. However, in the event the read address equals the write address and the read access follows the write access to the same address, the read operation includes transferring the new data from the bypass latch to an output of the memory device.

These methods may also include generating a match signal in response to detecting an equivalency between the write address and the read address and generating a loopback signal in response to at least the match signal. A first control signal may then be generated by gating the loopback signal with a second control signal generated during the reading operation. In particular, the operation to transfer the new data from the bypass latch to the output of the memory device may be performed in-sync with an edge of the first control signal and the sense amplifier may be responsive to the second control signal. In the event the sense amplifier is a multi-staged pulse sense amplifier, then the second control signal may be a latch enable signal associated with a last stage of the sense amplifier.

DESCRIPTION OF PREFERRED EMBODIMENTS

Figure 1:
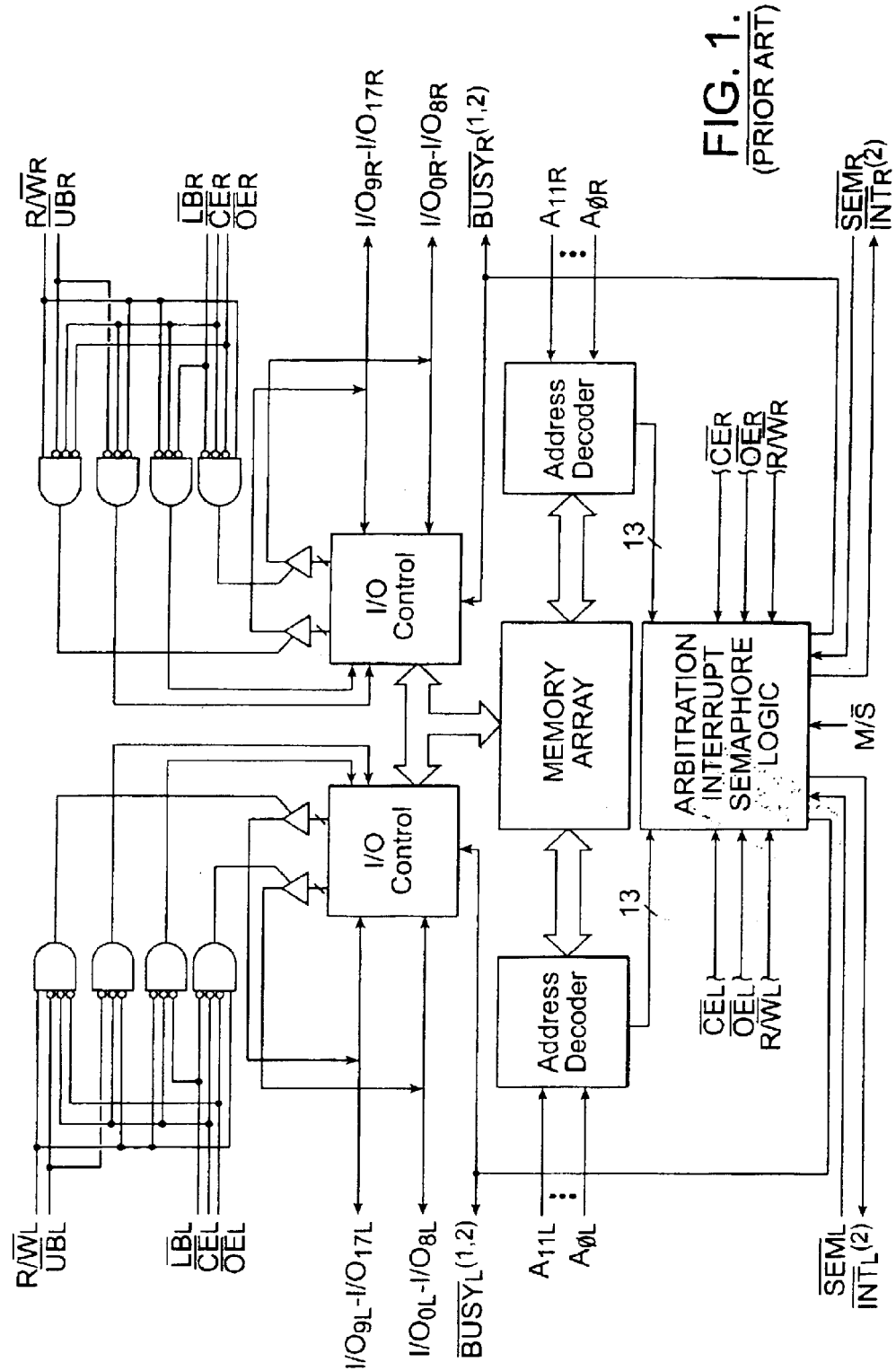
FIG. 1 is a block diagram of a dual-port asynchronous SRAM memory device according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be through and complete, and will fully convey the scope of the invention to those skilled in the art. Like reference numerals refer to like elements throughout and signal lines and signals thereon may be referred to by the same reference characters.

Figure 2:
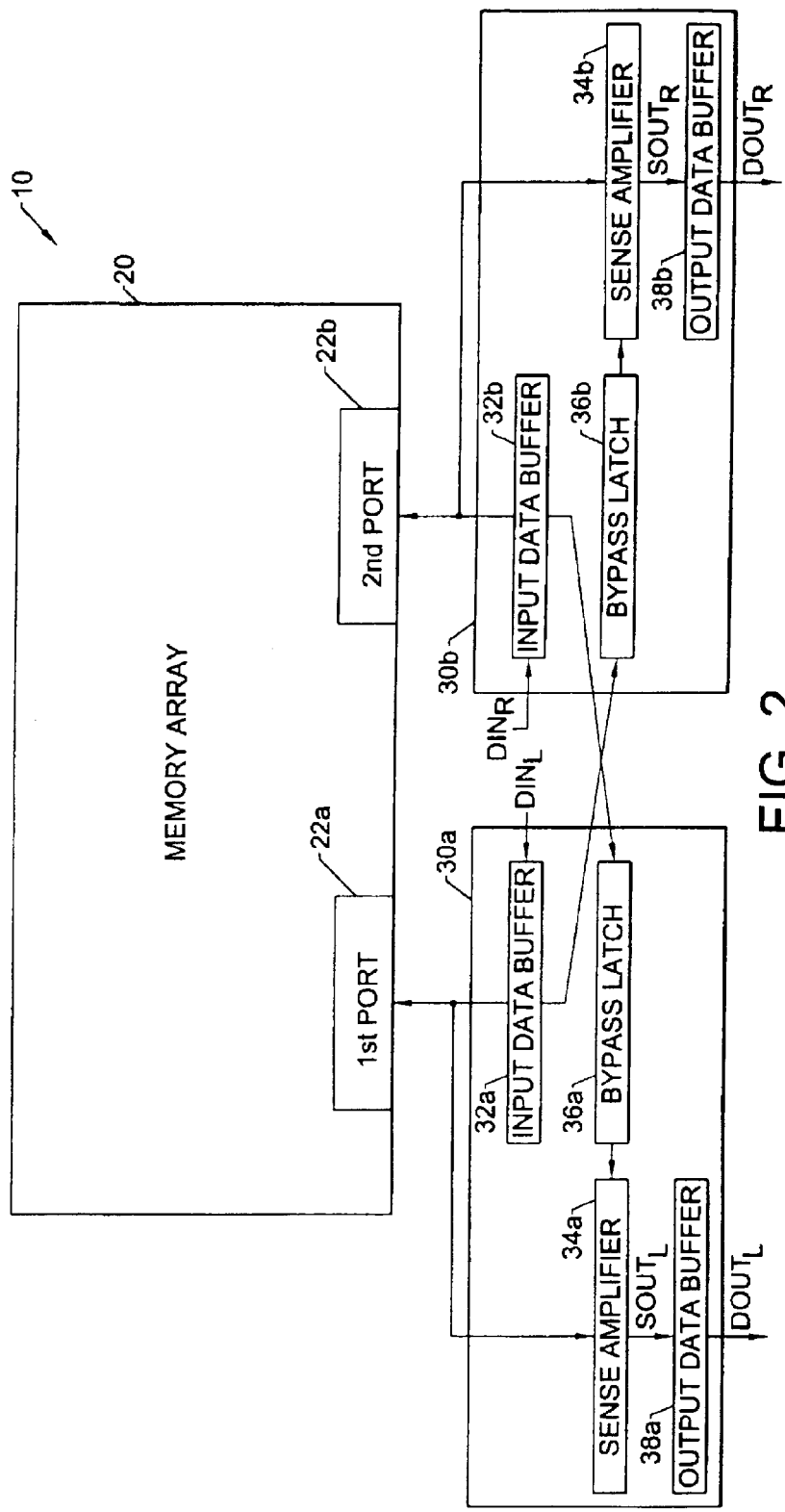
FIG. 2 is a block diagram of a memory device according to a first embodiment of the present invention.

Referring now to FIG. 2, an asynchronous multi-port memory device 10 according to a first embodiment of the present invention includes an integrated circuit memory array 20 having multiple ports. The memory array 20 may comprise static random access memory (SRAM) cells, for example. These multiple ports may include first and second ports 22a, 22b that can each support asynchronous read and write access. For purposes of illustration and discussion herein, the first port 22a will be treated as a write port and the second port 22b will be treated as a read port during an asynchronous left-to-right flow-through mode of operation. Right-to-left flow-through operation is also possible when the second port is writing and the first port is reading. The memory device 10 also includes first and second input/output (I/O) control circuits 30a and 30b that are coupled to the first and second ports 22a and 22b. As illustrated, the first I/O control circuit 30a includes a first input data buffer 32a, a first sense amplifier 34a, a first bypass latch 36a and a first output data buffer 38a. The first output data buffer 38a passes sense amplifier output data $SOUT_L$ provided by the first sense amplifier 34a to a left output data bus $DOUT_L$.

The second I/O control circuit 30b includes a second input data buffer 32b, a second sense amplifier 34b, a second bypass latch 36b and a second output data buffer 38b. The second output data buffer 38b passes sense amplifier output data $SOUT_R$ provided by the second sense amplifier 34b to a right output data bus $DOUT_R$.

As described more fully hereinbelow, the left side sense amplifier output data $SOUT_L$ may take the form of read data provided by the first port 22a during normal read operation or write data provided by the first bypass latch 36a during right-to-left flow-through operation, which occurs when the write address being accessed by the second port 22b equals the read address being accessed by the first port 22a. Similarly, the right side sense amplifier output data $SOUT_R$ may take the form of read data provided by the second port 22b during normal read operation or write data provided by the second bypass latch 36b during left-to-right flow-through operation, which occurs when the write address being accessed by the first port 22a equals the read address being accessed by the second port 22b.

During a left-to-right flow-through mode of operation, the first input data buffer 32a may provide first write data to the first port 22a of the memory array 20 and simultaneously provide the first write data to the second bypass latch 36b within the second I/O control circuit 30b. This first write data may be provided by a left input data bus ($DIN_L$). As illustrated, the second sense amplifier 34b within the second I/O control circuit 30b is electrically coupled to receive second read data from the second port 22b and also receive the latched first write data from the second bypass latch 36b. Alternatively, during a right-to-left flow-through mode of operation, the second input data buffer 32b may provide second write data to the second port 22b and simultaneously provide the second write data to the first bypass latch 36a within the first I/O control circuit 30a. This second write data may be provided by a right input data bus ($DIN_R$). The first sense amplifier 34a within the first I/O control circuit 30a is electrically coupled to receive first read data from the first port 22a and receive the latched second write data from the first bypass latch 36a. To reduce power consumption requirements, the first and second sense amplifiers 34a–34b may be pulsed sense amplifiers having a plurality of stages and will be treated herein as such. The construction and operation of fast multi-staged sense amplifiers in high density SRAMs is more fully described in section 8.13.5 of a textbook by B. Prince entitled "Semiconductor Memories," John Wiley & Sons, $2^{nd}$ Edition, ISBN 0471-92465-2, pp. 418–420 (1991). U.S. Pat. No. 5,991,209 to Chow, entitled "Split Sense Amplifier and Staging Buffer for Wide Memory Architecture," also discloses exemplary multi-stage sense amplifiers.

If a left-to-right flow-through-mode is active, then the second sense amplifier 34b may be enabled by a short duration pulse (SE) following a read address transition associated with the second port 22b. This short duration pulse blocks conventional flow-through of read data received from the second port 22b following a trailing edge of the enabling pulse (SE). Flow-through is nonetheless provided by preferred loopback operations that are performed in tandem between the first and second I/O control circuits 30a, 30b, as described more fully hereinbelow. These operations not only provide flow-through capability when the memory architecture does not support conventional flow-through, they also increase the speed at which newly written data to a first address can be output from the memory device in response to a read operation to the first address.

In the event the memory device 10 supports master and slave modes of operation, then the loopback operations will be active when (I) there is a match between the write address and the read address, (ii) access through the first port (second port) occurs earlier than access through the second port (first port) and (iii) the first port (second port) is writing and the second port (first port) is reading. If the /BUSY signals are held high in slave mode, then the loopback operations are active whenever the first port (second port) is writing to and the second port (first port) is reading from the same address within the memory array 20.

To achieve this flow-through functionality during master and slave modes of operation, an address match signal (MATCH), which is independent of the state of the /BUSY signals, is generated by an address comparator. Conventional address comparators may be used to generate the match signal MATCH. In the event the first port 22a and the second port 22b are writing to and reading from the same first address within the memory array 20, the match signal MATCH may be generated as an active high signal having a leading edge in-sync with a change of the read address to the first address and a trailing edge in-sync with a change of the write address from the first address to another address. If the flow-through mode is entered while the first port is writing and the second port is reading during master mode operation, then the read address change arrived, at the earliest, around the same time as the write address change associated with the first port. In some cases, on-chip arbitration circuitry may allow a flow-through mode to be entered when the read address change arrives just ahead of the write address change. In contrast, if the read address change occurred sufficiently before the write address change, then, as illustrated by TABLE 1, write operations to the first address will be inhibited until after the read operation has been performed from the first address and no flow-though will be performed.

According to a preferred aspect of the loopback operations described herein, the read data at the output of the second sense amplifier 34b is not overwritten with write data from the second bypass latch 36b until after the read data from the second port 22b has already been fully latched by the second sense amplifier 34b. If the read operation to a first address follows too closely an operation to write new data to the first address, then the read data latched by the second sense amplifier 34b may represent old data at the first address instead of the new data. This is because the new data has not had sufficient time to trickle through the addressed memory cells and be available for reading. In order to ensure that normal read timing is not affected by the loopback operations, the match signal MATCH is heavily deglitched so that it will not go active until shortly before an active low latch enable signal /LE goes inactive and thereby indicates a complete latching of the read data from the second port 22b. This active low latch enable signal /LE may be used to control a final stage of the aforementioned multi-stage pulsed sense amplifier. This deglitching operation is particularly significant if slave mode is to be supported by the memory device, because in slave mode, the match signal MATCH (and signals derived therefrom) can become inactive arbitrarily without violating specifications by using the /BUSY signal as an input. If the second sense amplifier 34b does not correctly latch the read data from the second port 22b, then this data may be corrupted when the match signal MATCH is arbitrarily terminated. To inhibit the likelihood of data corruption, the match signal MATCH (or a signal derived therefrom) is gated with the active low latch enable signal /LE.

Figure 3:
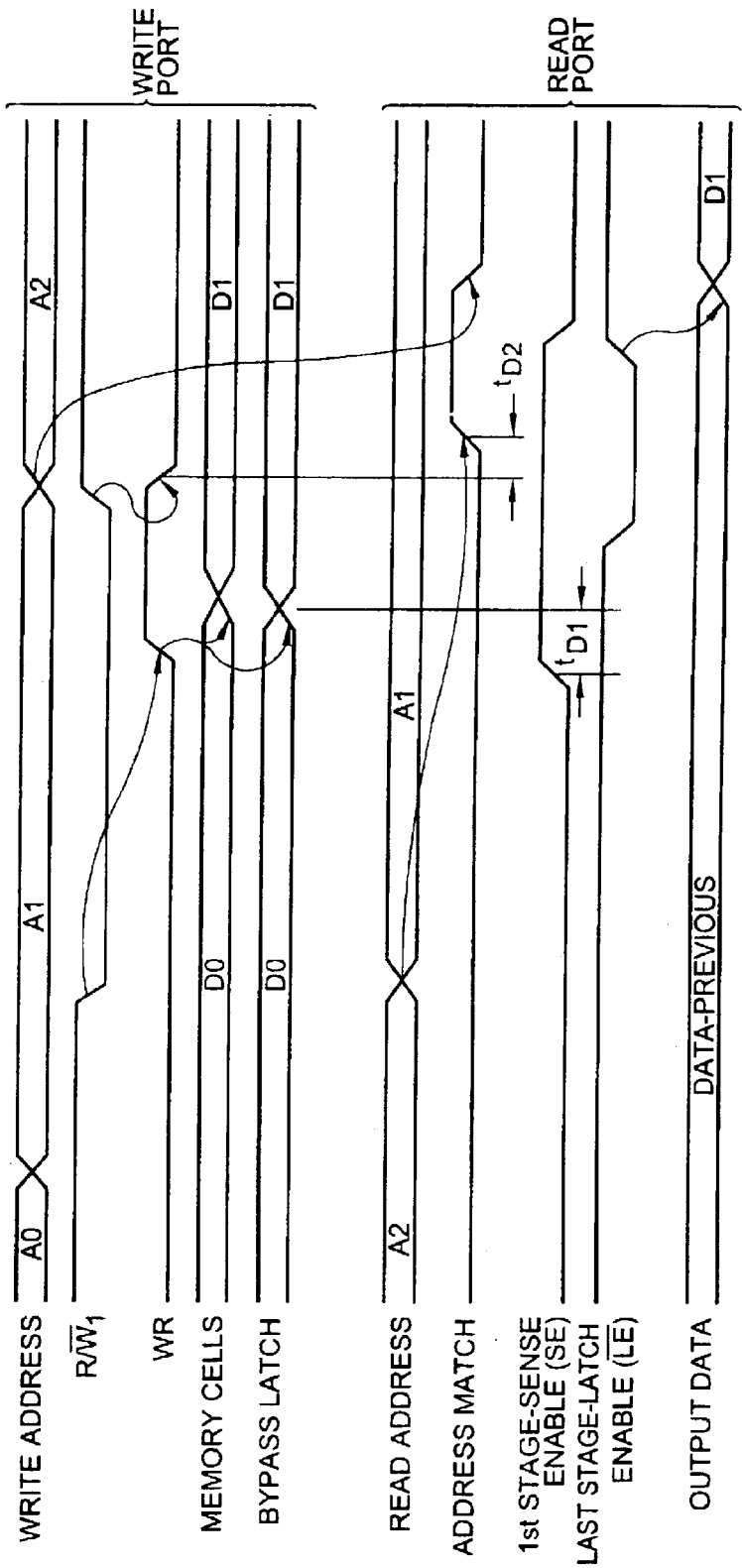
FIG. 3 is a timing diagram that illustrates operations performed by the memory device of FIG. 2, during short write cycles.

These loopback operations during the flow-through mode are more fully illustrated by the timing diagram of FIG. 3. In particular, FIG. 3 illustrates signals that describe operations associated with the first port 22a undergoing write operations (write port) and the second port 22b undergoing read operations (read port). During the write operations, an address decoder, such as the left-side address decoder illustrated by the conventional memory device of FIG. 1, receives a new write address (shown as A1) while the arbitration, interrupt and semaphore logic commences a write operation in-sync with a falling edge of a first external read/write command signal $R/\overline{W}_1$. Using conventional techniques, the receipt of a falling edge of the external read/write command signal $R/\overline{W}_1$ by the memory device 10 results in the generation of an active high internal write signal WR, which is illustrated as a write pulse. The leading edge of the internal write signal WR is generated in-sync with the falling edge of the external read/write command signal $R/\overline{W}_1$ and the trailing edge of the internal write signal WR is generated in-sync with the rising edge of the external read/write command signal $R/\overline{W}_1$, using conventional operations. Based on these operations the old memory cell data (D0) at the new write address A1 will be overwritten by the new write data (D1) in response to the leading edge of the internal write signal WR. The new write data may also be loaded into the second bypass latch 36b, in response to the leading edge of the internal write signal WR. Accordingly, the operations to write new data into an addressed row a memory cells within the memory array 20 preferably occur in parallel with operations to load the second bypass latch 36b with the new write data.

During read operations, an address decoder, such as the right-side address decoder of FIG. 1, receives a new read address (shown as A1) while the arbitration, interrupt and semaphore logic commences a read operation to the second port 22b in-sync with a rising edge of a second external read/write command signal $R/\overline{W}_2$ (not shown). The receipt of the read address and the timing of the rising edge of the second external read/write command signal occur asynchronously relative to the timing of the write address and the rising edge of the first external read/write command signal $R/\overline{W}_1$, shown by FIG. 3. The address match signal MATCH, which may be generated by a read/write address comparator, has a leading edge that is generated in-sync with the new read address A1 and a falling edge that is generated in-sync with a termination of the write address A1. As illustrated by the time interval $t_{D1}$, the sense amplifier enable signal SE that enables the second sense amplifier 34b may undergo a rising transition to acquire the read data from the second port 22b before the new write data has been stored in the row of memory cells located at the first address A1. Thus, the read data initially acquired by the second sense amplifier 34b will be the old data instead of the new data. The timing of the active low latch enable signal /LE associated with a final stage of the second sense amplifier 34b is also preferably set so that the leading (e.g., falling) edge of the active low latch enable signal /LE occurs before the leading edge of the match signal MATCH. While the latch enable signal /LE is low, the loopback operations will be suspended and the read data in the second sense amplifier 34b will remain latched. As explained more fully hereinbelow, during flow-through mode, a loopback signal can be generated and gated with the active low latch enable signal /LE to guarantee that any loopback operations performed in response to an address match will not interfere with the reading operations performed by the second port. Moreover, the loopback operations can be performed to make the newly written data available for output without having to incur the additional time penalty associated with waiting for new write data to "trickle" or "fall" through the memory cells before latching the read port sense amplifiers.

As described above, the condition for bypassing the row of addressed memory cells during a read operation from one port is that the other port is writing and commenced its access to the memory array 20 first. However, as illustrated by the timing diagram of FIG. 3, if only the address match signal MATCH and the internal write pulse WR are used to determine a match and control the loopback operations, then the match condition may be missed. As will be understood by those skilled in the art, the internal write pulse WR is heavily deglitched to ensure good address set-up spec (e.g., $t_{as}$) and good write noise immunity. If minimum write pulse timing (i.e., minimum $t_{wp}$) is present, then only a narrow write pulse may be present to recognize the loopback condition. Moreover, because the address match signal MATCH heavily deglitched to protect against mismatches due to address skew is also delayed to ensure that it does not go active until the active low latch enable signal /LE transitions low to latch the read data, the internal write signal WR and the match signal MATCH may not overlap if minimum write pulse timing is used. This lack of overlap is illustrated by the time interval $t_{D2}$ in FIG. 3.

To ensure that the loopback operations are properly performed when minimum write pulse timing is present, the internal write signal WR may be OR'd with a one-shot pulse (WRITE-OS) generated off the rising edge of the internal write signal WR. This aspect of the present invention is illustrated by the timing diagram of FIG. 4. The width of the time interval $t_{D2}$ determines the minimum amount of time by which the one-shot pulse WRITE-OS should extend beyond the internal write signal WR to ensure correct operation for short write cycles. Nonetheless, the pulse width of the one-shot pulse WRITE-OS should not be made too large in order to prevent the incorrect capture of new data written to the write port during a subsequent write cycle. The signal generated by this ORing operation (between WR and WRITE-OS) can then be combined (e.g., ANDed) with the address match signal MATCH using combinational logic to produce a loopback signal LOOPBACK. This loopback signal LOOPBACK is preferably gated with the latch enable signal /LE so that a trailing edge of the latch enable signal /LE can be used to trigger the transfer of the new write data from the second bypass latch 36b to the outputs of the sensed sense amplifier 36b when the loopback signal LOOPBACK is active.

Figure 6:
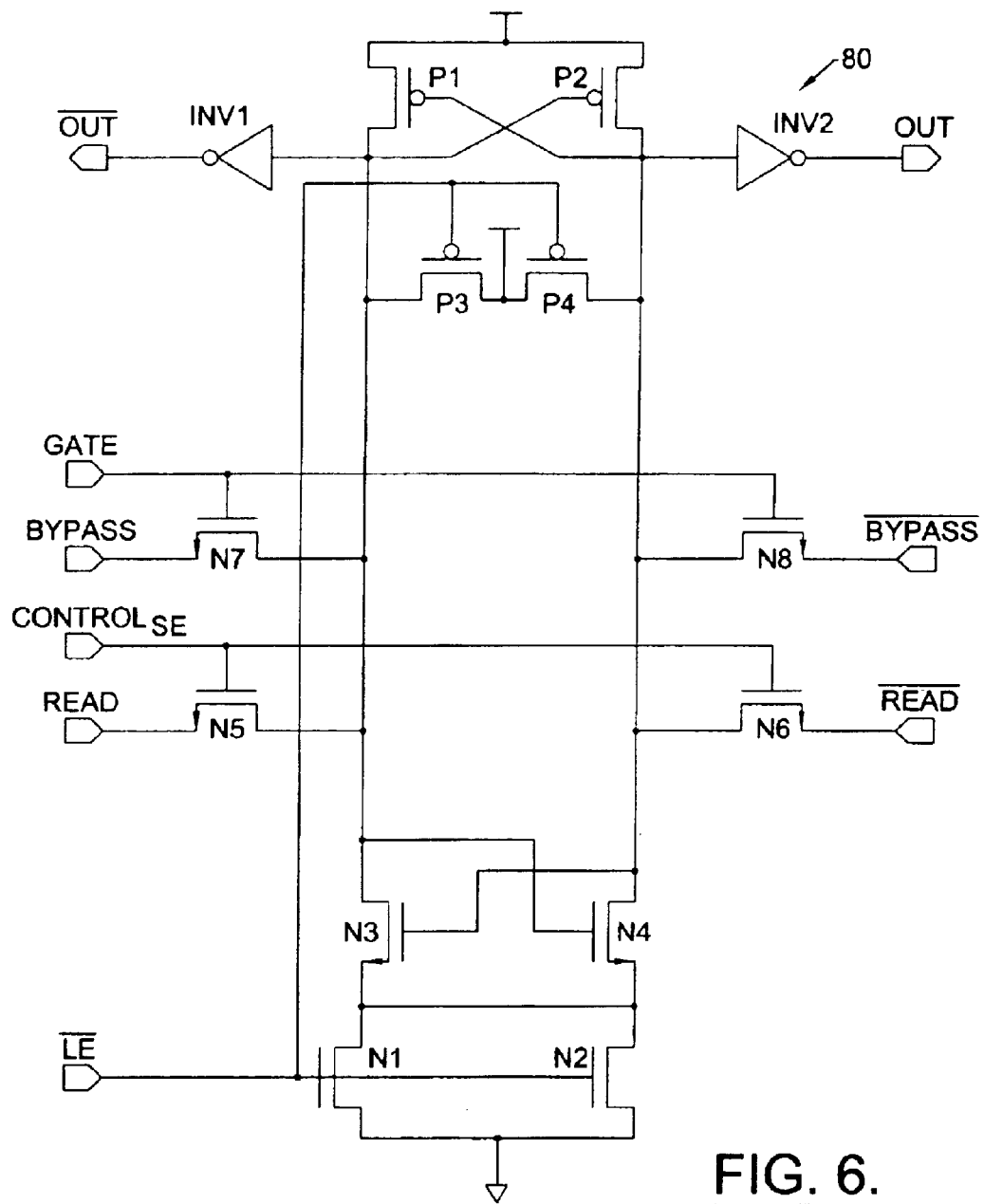
FIG. 6 is an electrical schematic of a final stage of a multi-stage pulsed sense amplifier that can receive data provided by a bypass latch during loopback operations.

For example, the result of this gating operation could be used alone or in combination with other control signals to generate a gate signal (GATE). This gate signal GATE can be used to turn on pass transistors that transfer write data from the second bypass latch 36b to the second sense amplifier 34b outputs. This transfer will overwrite the old read data present at the outputs, but will not interfere with the initial capture of that read data by the second sense amplifier 34b. Accordingly, if the sense amplifier stage 80 of FIG. 6 is utilized as a final stage within the first and second sense amplifiers 34a, 34b, then the gate signal GATE can be used to transfer write data (shown as BYPASS and /BYPASS) from a bypass latch onto a pair of differential signal lines, while the active low latch enable signal /LE is inactive. This transfer results in an overwrite of the read data provided to the differential signal lines while the latch enable signal /LE is active. This read data may be provided to the differential signal lines during a read operation by driving a sense amplifier control signal line (CONTROL$_{SE}$) high so that complementary read data (READ, /READ) can be passed from an earlier stage of the sense amplifier to the final stage 80. The illustrated sense amplifier stage 80 comprises a pair of cross-coupled PMOS transistors P1 and P2, a pair of cross-coupled NMOS transistors N3 and N4, a pair of NMOS pull-down transistors N1 and N2 that are responsive to the latch enable signal /LE and a pair of weak load transistors P3 and P4 that are also responsive to the latch enable signal /LE. A first pair of NMOS access transistors N7 and N8 are provided as a pair of switches that control the transfer of bypassed write data to the illustrated pair of differential signal lines, in response to the gate signal GATE. Similarly, a second pair of NMOS access transistors N5 and N6 are provided as a pair of switches that control the transfer of read data to the illustrated pair of differential signal lines, in response to the control signal CONTROL$_{SE}$.

Figure 4:
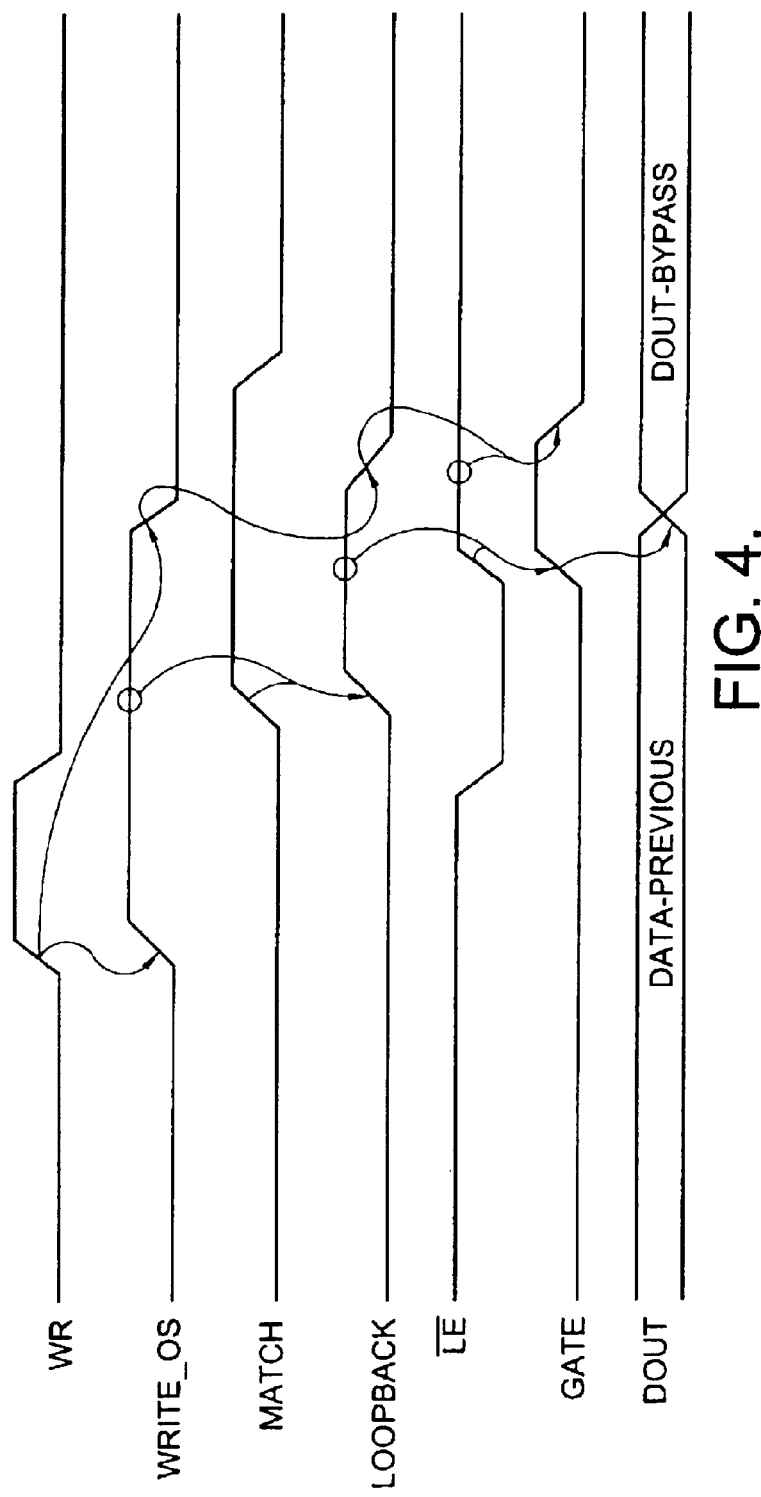
FIG. 4 is timing diagram that illustrates loopback operations performed by the memory device of FIG. 2.
Figure 5:
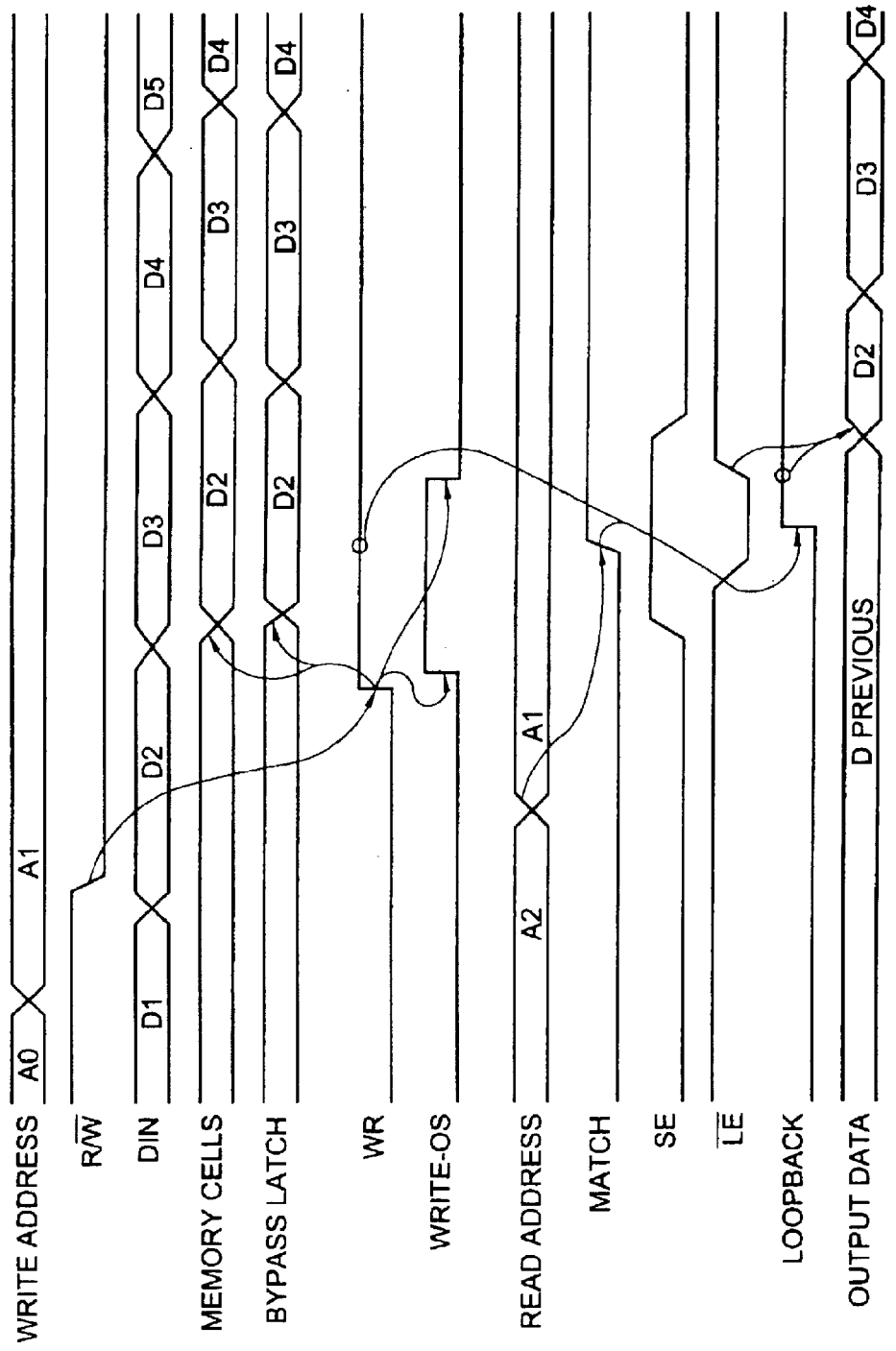
FIG. 5 is a timing diagram that illustrates operations performed by the memory device of FIG. 2, during long write cycles.

The timing diagram of FIG. 5 is similar to the short write cycle timing diagrams of FIGS. 3–4, however, operations performed during a relatively long write cycle are illustrated. During this longer write cycle, the write data is changed multiple times and each of these changes is passed through the second bypass latch 36b to the second output data buffer 38b while the read and write addresses are held equal to each other during a left-to-write flow-through. Because the internal write signal WR may be held active for a long write cycle, the one-shot pulse WRITE-OS, which is generated off a leading edge of the internal write signal WR, becomes superfluous. Once the internal write pulse WR and continuous match signal MATCH are generated and trigger a leading edge of the loopback signal LOOPBACK, subsequent changes in the write data DIN$_L$ are passed from the second bypass latch 36b to the outputs of the second sense amplifier 34b and then to the second output data buffer 38b. These loopback operations are performed without disturbing the initial read operation that was triggered in response to the read address change from address A2 to address A1.

Figure 7:
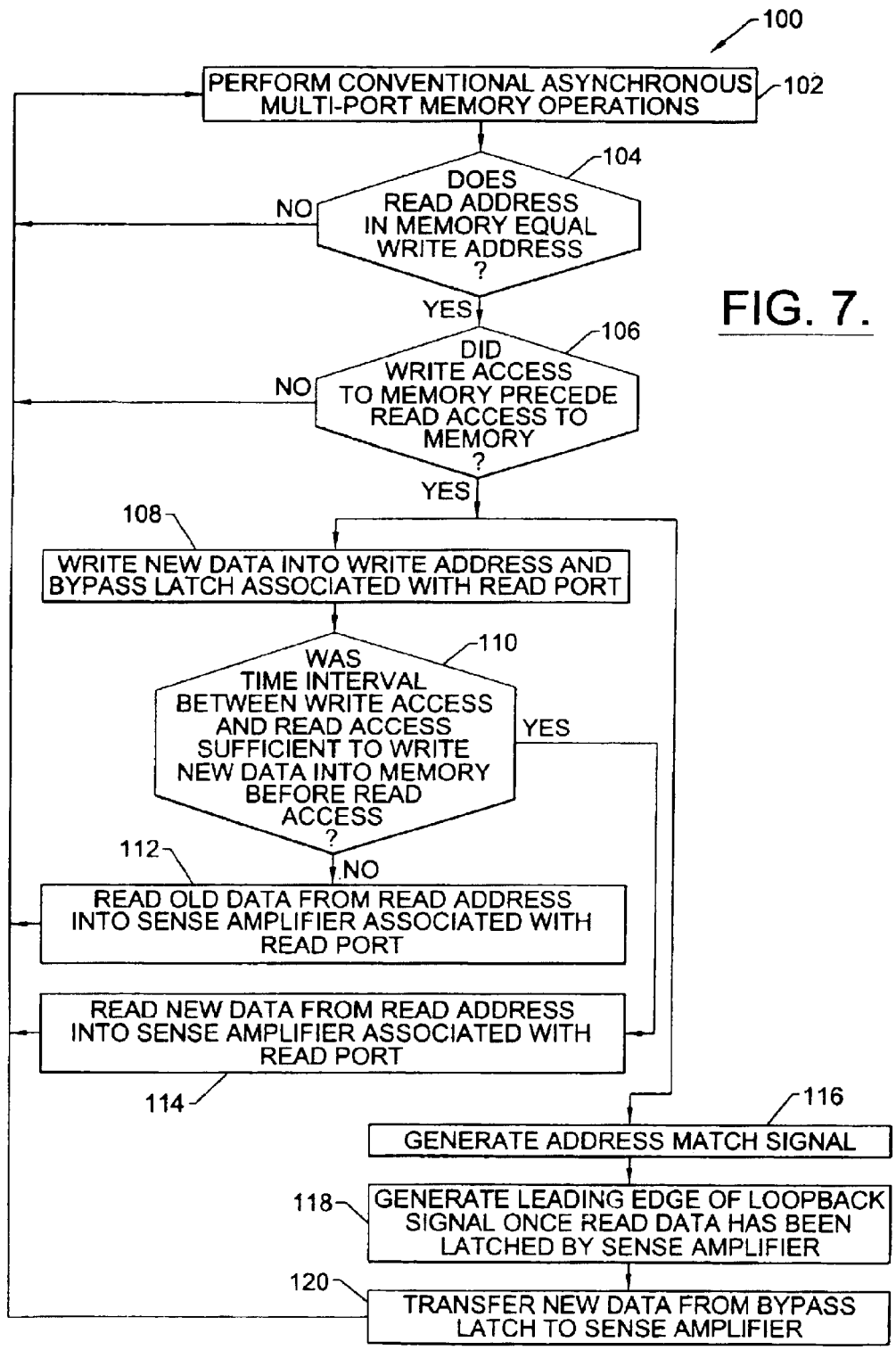
FIG. 7 is a flow diagram that illustrates operations performed by the memory device of FIG. 2.

Referring now to the flow diagram of FIG. 7, operations 100 associated with preferred asynchronous flow-through modes include evaluating multi-port memory operations, Block 102, to detect the occurrence of a match between the read address and the write address, Block 104. An operation is also performed to determine whether the new write address was asserted before the matching read address, Block 106. If the assertion of the new write address did not precede the assertion of the matching read address, then the conventional technique of blocking the write operation until after the read operation has been completed is followed (see, e.g., Table 1) and control is returned to Block 102. However, if the write address change occurred before the matching read address change, then an operation is performed to write new data to the write address within a memory array and also transfer that new data directly to a bypass latch associated with the read port, Block 108. Although not shown, the bypass latch is also preferably updated with new write data during each write operation, even when the read and write addresses are not the same. An address match signal is also generated based on the equality between the read and write addresses, Block 116.

As illustrated by Block 110, if the time interval between the write access and read access to the memory is sufficiently long to allow writing of the new data to the addressed memory cells prior to the read access, then the new data will be read from the read address into a sense amplifier associated with the read port, Block 114. However, if the read address change closely follows the write address change, then, as illustrated by Block 112, the old data is read into the sense amplifier associated with the read port.

Referring now to Block 118, once the read data (old or new) has been fully latched by the sense amplifier, a leading edge of the loopback signal is generated. The loopback signal may be generated by combining (e.g., ORing) the internal write signal WR with the WRITE-OS pulse and combining (e.g., ANDing) that result with the address match signal MATCH. The loopback signal may then be combined (e.g., gated) with the latch enable signal (/LE) associated with a final stage of the sense amplifier to generate a gate signal having a leading edge that is in-sync with a trailing edge of the latch enable signal. The gate signal can then be used to transfer the new write data directly from the bypass latch to the output of the sense amplifier, Block 120.

Figure 8:
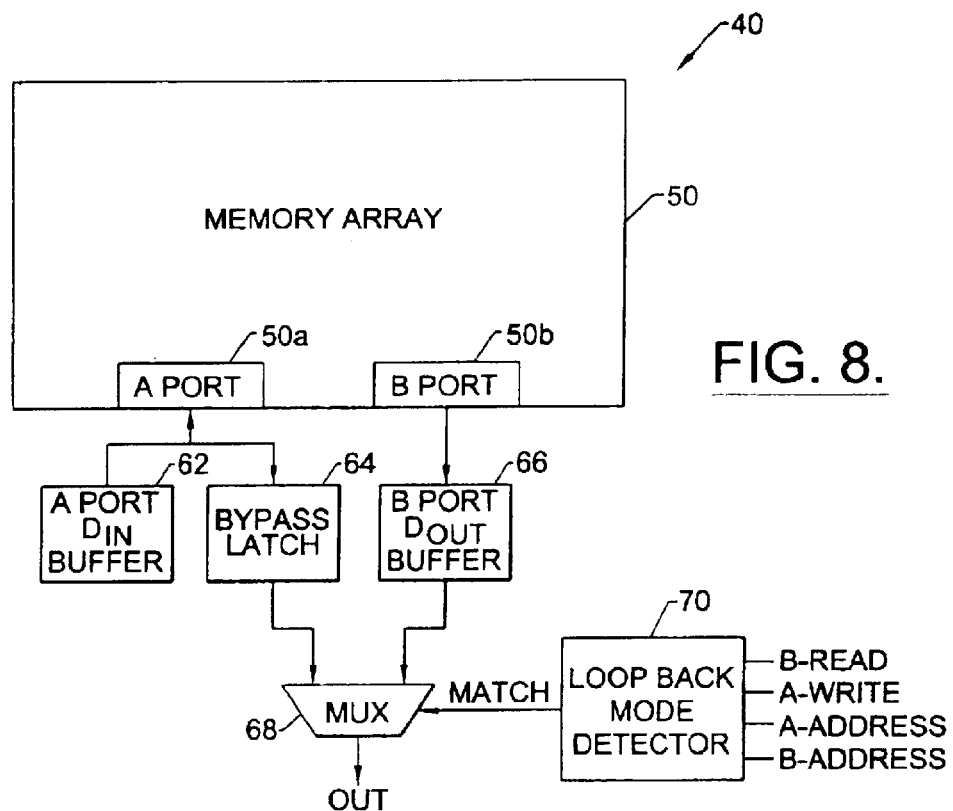
FIG. 8 is a block diagram of a memory device according to a second embodiment of the present invention.

Referring now to FIG. 8, an asynchronous multi-port memory device 40 according to another embodiment of the present invention includes a memory array 50 having an A-port 50a and a B-port 50b that can each support read and write access. An A-port input data buffer 62 is provided to buffer write data that is provided to the A-port during a write operation and a bypass latch 64 that may be associated with the B-port 50b. A B-port output data buffer 66 is also provided to buffer read data that is received from the B-port during a read operation. The outputs of the bypass latch 64 and the B-port output data buffer 66 are coupled as inputs to a multiplexer 68. As illustrated, the select input of the multiplexer 68 is responsive to a match signal MATCH. This match signal MATCH may be generated by a loopback mode detector 70 that is responsive to read and write control signals (shown as A-READ and B-READ) and address signals (shown as A-ADDRESS and B-ADDRESS). The loopback mode detector 70 may be configured to generate a lead edge of the match signal MATCH when the read and write addresses are the same and the read access from port-B closely follows a write access to port-A. These illustrated devices provide A-to-B flow-through. Mirror image circuitry may also be included to provide B-to-A flow-through.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. In an integrated circuit memory device comprising a memory array having first and second ports that can each support asynchronous read and write access and a pulsed sense amplifier that receives data from the second port, a method of operating the memory device, comprising the steps of:
   writing first data from a data input buffer coupled to the first port to a write address in the memory array while simultaneously writing a copy of the first data to a bypass latch associated with the second port;
   reading second data from a read address in the memory array by activating the pulsed sense amplifier to latch the second data; and
   overwriting the latched second data with the copy of the first data from the bypass latch;
   wherein said writing step comprises overwriting old data at the write address with new data; wherein the read address equals the write address; and wherein the second data latched by the pulsed sense amplifier during said reading step is the new data.

2. In an integrated circuit memory device comprising a memory array having first and second ports that can each support asynchronous read and write access and a pulsed sense amplifier that receives data from the second port, a method of operating the memory device, comprising the steps of:
   writing first data from a data input buffer coupled to the first port to a write address in the memory array while simultaneously writing a copy of the first data to a bypass latch associated with the second port;
   reading second data from a read address in the memory array by activating the pulsed sense amplifier to latch the second data; and
   overwriting the latched second data with the copy of the first data from the bypass latch
   wherein said writing step comprises overwriting old data at the write address with new data;
   wherein the second data latched by the pulsed sense amplifier is the old data; and
   wherein said reading step comprises activating the pulsed sense amplifier to latch the second data at an output thereof and block flow-through of the first data from the memory array to the output of the pulsed sense amplifier.

3. In an integrated circuit memory device comprising a memory array having first and second ports that can each support asynchronous read and write access and a pulsed sense amplifier that receives data from the second port, a method of operating the memory device, comprising the steps of:
   writing first data from a data input buffer coupled to the first port to a write address in the memory array while simultaneously writing a copy of the first data to a bypass latch associated with the second port;
   reading second data from a read address in the memory array by activating the pulsed sense amplifier to latch the second data;
   overwriting the latched second data with the copy of the first data from the bypass latch; and
   comparing the write address to the read address and generating a leading edge of a match signal if said comparing step indicates an equivalency;
   wherein the second data is latched in response to a leading edge of a latch enable signal; and
   wherein the latched second data is overwritten with the copy of the first data from the bypass latch if and only if the match signal is active when a trailing edge of the latch enable signal occurs.

4. In an integrated circuit memory device comprising a memory array having first and second ports that can each support asynchronous read and write access and a pulsed sense amplifier that receives data from the second port, a method of operating the memory device, comprising the steps of:
   writing first data from a data input buffer coupled to the first port to a write address in the memory array while simultaneously writing a copy of the first data to a bypass latch associated with the second port;
   reading second data from a read address in the memory array by activating the pulsed sense amplifier to latch the second data;
   overwriting the latched second data with the copy of the first data from the bypass latch; and
   comparing the write address to the read address and generating a leading edge of a match signal if said comparing step indicates an equivalency;
   wherein said writing step comprises overwriting old data at the write address with new data;

wherein the second data latched by the pulsed sense amplifier is the old data;

wherein the second data is latched in response to a leading edge of a latch enable signal; and wherein the latched second data is overwritten with the copy of the first data from the bypass latch if and only if the match signal is active when a trailing edge of the latch enable signal occurs.

5. A method of operating an integrated circuit memory device having first and second ports that can each support read and write access to a memory array therein, said method comprising the steps of:

writing new data from the first port to a write address in the memory array and a bypass latch associated with the second port;

reading old data from a read address in the memory array by activating a pulsed sense amplifier associated with the second port;

overwriting the old data read from the read address with the new data from the bypass latch; and generating a match signal in response to detecting of an equivalency between the write address and the read address;

wherein said writing and reading steps occur asynchronously relative to each other; and wherein said writing step comprises generating an internal write signal having a leading edge in-sync with an edge of a write signal associated with the first port.

6. The method of claim 5, further comprising the step of generating a loopback signal from at least the match signal and the internal write signal.

7. The method of claim 6, wherein activating the pulsed sense amplifier comprises latching the old data at an output of the pulses sense amplifier in response to a leading edge of a latch enable signal.

8. The method of claim 7, wherein said overwriting step comprises overwriting the latched old data with the new data from the bypass latch in response to a trailing edge of the latch enable signal.

9. The method of claim 6, wherein activating the pulsed sense amplifier comprises latching the old data in-sync with a leading edge of a latch enable signal; and wherein said overwriting step comprises overwriting the latched old data with the new data from the bypass latch in-sync with a trailing edge of the latch enable signal.

10. The method of claim 9, wherein said overwriting step comprises overwriting the latched old data with the new data from the bypass latch in-sync with a leading edge of a signal generated by gating the latch enable signal with the loopback signal using combinational logic.

11. The method of claim 6, wherein said step of generating a loopback signal comprises generating a one-shot pulse in response to a leading edge of the write signal and gating the one-shot pulse with the match signal.

12. A method of operating an integrated circuit memory device having first and second ports that can each support read and write access to a memory array therein, said method comprising the steps of:

writing new data from the first port to a write address in the memory array and a bypass latch associated with the second port;

reading old data from a read address in the memory array by activating a pulsed sense amplifier associated with the second port;

overwriting the old data read from the read address with the new data from the bypass latch; and generating a match signal in response to detecting of an equivalency between the write address and the read address;

wherein said writing and reading steps occur asynchronously relative to each other; and wherein said writing and reading steps comprise applying equivalent write and read addresses to the memory device; and wherein the match signal has a leading edge that is in-sync with applying the read address to the memory device and a trailing edge that is in-sync with a termination of applying the write address to the memory device.

13. A method of operating an asynchronous integrated circuit memory device having first and second ports that can each support read and write access to a memory array therein, said method comprising the steps of:

writing new data from the first port to a write address in the memory array and a bypass latch associated with the second port;

reading old data from a read address in the memory array by activating a sense amplifier associated with the second port;

overwriting the old data read from the read address with the new data from the bypass latch; and generating a match signal in response to detecting of an equivalency between the write address and the read address;

wherein said writing step comprises generating an internal write signal having a leading edge in-sync with a leading edge of an active low write signal associated with the first port.

14. The method of claim 13, further comprising the step of generating a loopback signal from at least the match signal and the internal write signal.

15. The method of claim 14, wherein activating the sense amplifier comprises latching the old data at an output of the sense amplifier in response to a leading edge of an active low latch enable signal.

16. The method of claim 15, wherein said overwriting step comprises overwriting the latched old data with the new data from the bypass latch in response to a trailing edge of the active low latch enable signal.

17. The method of claim 14, wherein the sense amplifier is a pulsed sense amplifier; wherein activating the pulsed sense amplifier comprises latching the old data in-sync with a leading edge of an active low latch enable signal; and wherein said overwriting step comprises overwriting the latched old data with the new data from the bypass latch in-sync with a trailing edge of the active low latch enable signal.

18. The method of claim 17, wherein said overwriting step comprises overwriting the latched old data with the new data from the bypass latch in-sync with a leading edge of a signal generated by gating the active low latch enable signal with the loopback signal.

19. The method of claim 14, wherein said step of generating a loopback signal comprises generating a one-shot pulse in response to a leading edge of the write signal and gating the one-shot pulse with the match signal.

20. A method of operating an asynchronous integrated circuit memory device having first and second ports that can each support read and write access to a memory array therein, said method comprising the steps of:

writing new data from the first port to a write address in the memory array and a bypass latch associated with the second port;

reading old data from a read address in the memory array by activating a sense amplifier associated with the second port;

overwriting the old data read from the read address with the new data from the bypass latch; and generating a match signal in response to detecting of an equivalency between the write address and the read address;

wherein said writing and reading steps comprise applying equivalent write and read addresses to the memory device; and wherein the match signal has a leading edge that is in-sync with applying the read address to the memory device and a trailing edge that is in-sync with a termination of applying the write address to the memory device.

21. An integrated circuit memory device, comprising:

a memory array having first and second ports that can each support asynchronous read and write access;

a first input/output control circuit that is electrically coupled to the first port and comprises a first sense amplifier configured to receive read data from the first port and a first bypass latch having an output coupled to the first sense amplifier; and a second input/output control circuit that is electrically coupled to the second port and comprises a second sense amplifier configured to receive read data from the second port and a second bypass latch having an output coupled to the second sense amplifier and an input coupled to receive write data from said first input/output control circuit.

22. The device of claim 21, wherein said first sense amplifier comprises a pulsed sense amplifier.

23. The device of claim 21, wherein said first input/output control circuit comprises an input data buffer having an output electrically coupled to the input of the second bypass latch.

24. The device of claim 21, wherein the first sense amplifier comprises a multi-stage sense amplifier; and wherein the first bypass latch has an output electrically coupled to a last stage of the multi-stage sense amplifier.

25. A method of operating an asynchronous integrated circuit memory device having first and second ports that can each support read and write access to a memory array therein, said method comprising the steps of:

writing new data from the first port to a write address in the memory array and a bypass latch associated with the second port;

reading old data from a read address in the memory array to a sense amplifier associated with the second port;

transferring the new data from the bypass latch to an output of the memory device;

generating a match signal in response to detecting an equivalency between the write address and the read address;

generating a loopback signal in response to at least the match signal; and generating a first control signal by gating the loopback signal with a second control signal generated during said reading step.

26. The method of claim 25, wherein said transferring step is performed in-sync with an edge of the first control signal.

27. The method of claim 26, wherein the sense amplifier is responsive to the second control signal.

* * * * *